(12) United States Patent
Zheng

(10) Patent No.: US 8,448,571 B2
(45) Date of Patent: May 28, 2013

(54) METHOD FOR SCREEN PRINTING PRINTED CIRCUIT BOARD SUBSTRATE

(75) Inventor: Xiao-Fei Zheng, Shenzhen (CN)

(73) Assignees: FuKui Precision Component (Shenzhen) Co., Ltd., Shenzhen (CN); Zhen Ding Technology Co., Ltd., Tayuan, Taoyuan (TW)

( * ) Notice: Subject to any disclaimer, the term of this patent is extended or adjusted under 35 U.S.C. 154(b) by 162 days.

(21) Appl. No.: 13/171,464

(22) Filed: Jun. 29, 2011

(65) Prior Publication Data
US 2012/0055356 A1    Mar. 8, 2012

(30) Foreign Application Priority Data
Sep. 6, 2010   (CN) .......................... 2010 1 0273496

(51) Int. Cl.
| B41M 1/12 | (2006.01) |
| B41C 1/14 | (2006.01) |
| B41L 13/00 | (2006.01) |
| H05K 1/03 | (2006.01) |

(52) U.S. Cl.
USPC ........ 101/129; 101/128.4; 101/128; 101/127; 174/255

(58) Field of Classification Search
CPC ........ H05K 3/1216; H05K 2201/09936; H05K 2203/166
USPC .......... 101/128, 128.1, 128.4, 129; 438/401, 438/129; 427/97.1, 98.4, 97.3
See application file for complete search history.

(56) References Cited

U.S. PATENT DOCUMENTS

| 6,091,026 A * | 7/2000 | Yang ............................. 174/255 |
| 7,412,923 B2 * | 8/2008 | Shaeffer et al. ............... 101/127 |
| 7,854,197 B2 * | 12/2010 | Yeh et al. ...................... 101/129 |

FOREIGN PATENT DOCUMENTS

TW            540963         7/2003

* cited by examiner

Primary Examiner — Judy Nguyen
Assistant Examiner — John M Royston
(74) Attorney, Agent, or Firm — Altis Law Group, Inc.

(57) ABSTRACT

A method for screen printing a printed circuit board substrate comprises the following steps. A printed circuit board substrate including a copper foil layer is provided. Pluralities of marks are formed on the copper foil layer. A plurality of printing screens are provided, each includes an screen pattern and an opening corresponding to a respective mark. Printing material is applied on the ith screen Si to form an ith printing pattern and cover the ith mark at the ith opening, the ith printing pattern conforms to the ith screen pattern; checking whether the ith mark is covered by the printing material when i is less than N. Printing material is applied on the (i+1)th screen $S_{i+1}$ so as to form an (i+1)th printing pattern on the copper foil layer and covers the (i+1)th Mark $M_{i+1}$ at the (i+1)th opening, if the ith mark is covered by the printing material.

8 Claims, 8 Drawing Sheets

```
┌─────────────────────────────────────────────────────────┐
│ Providing a printed circuit board substrate comprising  │
│ an insulating layer and a copper foil layer formed on   │
│ the insulating layer                                    │
└─────────────────────────────────────────────────────────┘
                            │
                            ▼
┌─────────────────────────────────────────────────────────┐
│ Forming multiple marks {Mi}, i = 1, 2, . . ., N, on the │
│ copper foil layer, N being an integer equal to or       │
│ greater than two                                        │
└─────────────────────────────────────────────────────────┘
                            │
                            ▼
┌─────────────────────────────────────────────────────────┐
│ Providing multiple screens{Si}, i = 1, 2, . . ., N,     │
│ wherein the ith screen Si comprises an ith screen       │
│ pattern and an ith opening spatially corresponding to   │
│ the ith mark Mi                                         │
└─────────────────────────────────────────────────────────┘
                            │
                            ▼
┌─────────────────────────────────────────────────────────┐
│ Attaching the ith screen Si on the copper foil layer in │
│ a manner such that the ith Mark Mi is exposed at the    │
│ ith opening                                             │
└─────────────────────────────────────────────────────────┘
                            │
                            ▼
┌─────────────────────────────────────────────────────────┐
│ Applying printing material on the ith screen Si so as   │
│ to form an ith printing pattern on the copper foil      │
│ layer and cover the ith Mark Mi at the ith opening, the │
│ ith printing pattern conforming to the ith screen       │
│ pattern                                                 │
└─────────────────────────────────────────────────────────┘
                            │
                            ▼
┌─────────────────────────────────────────────────────────┐
│ Checking whether the ith mark is covered by the         │
│ printing material when i is less than N                 │
└─────────────────────────────────────────────────────────┘
                            │
                            ▼
┌─────────────────────────────────────────────────────────┐
│ Applying printing material on the (i+1)th screen Si+1   │
│ so as to form an (i+1)th printing pattern on the copper │
│ foil layer and cover the (i+1)th Mark Mi+1 at the       │
│ (i+1)th opening, if the ith mark is covered by the      │
│ printing material                                       │
└─────────────────────────────────────────────────────────┘
```

FIG. 1

METHOD FOR SCREEN PRINTING PRINTED CIRCUIT BOARD SUBSTRATE

BACKGROUND

1. Technical Field

The present disclosure generally relates to printed circuit boards (PCBs) and particularly, relates to a method for screen printing a printed circuit board substrate.

2. Description of Related Art

PCBs are widely used in most electronic devices for mounting electronic components and providing electrical connections. With the improvements in printing technology, more and more printing patterns can be formed on a surface of the PCB via printing processes. However, it is difficult to avoid missing one or more printing processes because of manual factors. Moreover, the PCB without passing one or more necessary processes may be discarded.

What is needed, therefore, is a method for screen printing a printed circuit board substrate to overcome the above-described problems.

BRIEF DESCRIPTION OF THE DRAWINGS

Many aspects of the present embodiment can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

FIG. 1 is a flow chart showing a method for screen a printing PCB substrate in accordance with an exemplary embodiment.

DETAILED DESCRIPTION

Embodiments will now be described in detail below and with reference to the drawings.

Referring to FIG. 1, a method for screen printing a printed circuit board substrate in accordance with an exemplary embodiment includes the following steps.

Figure 2:
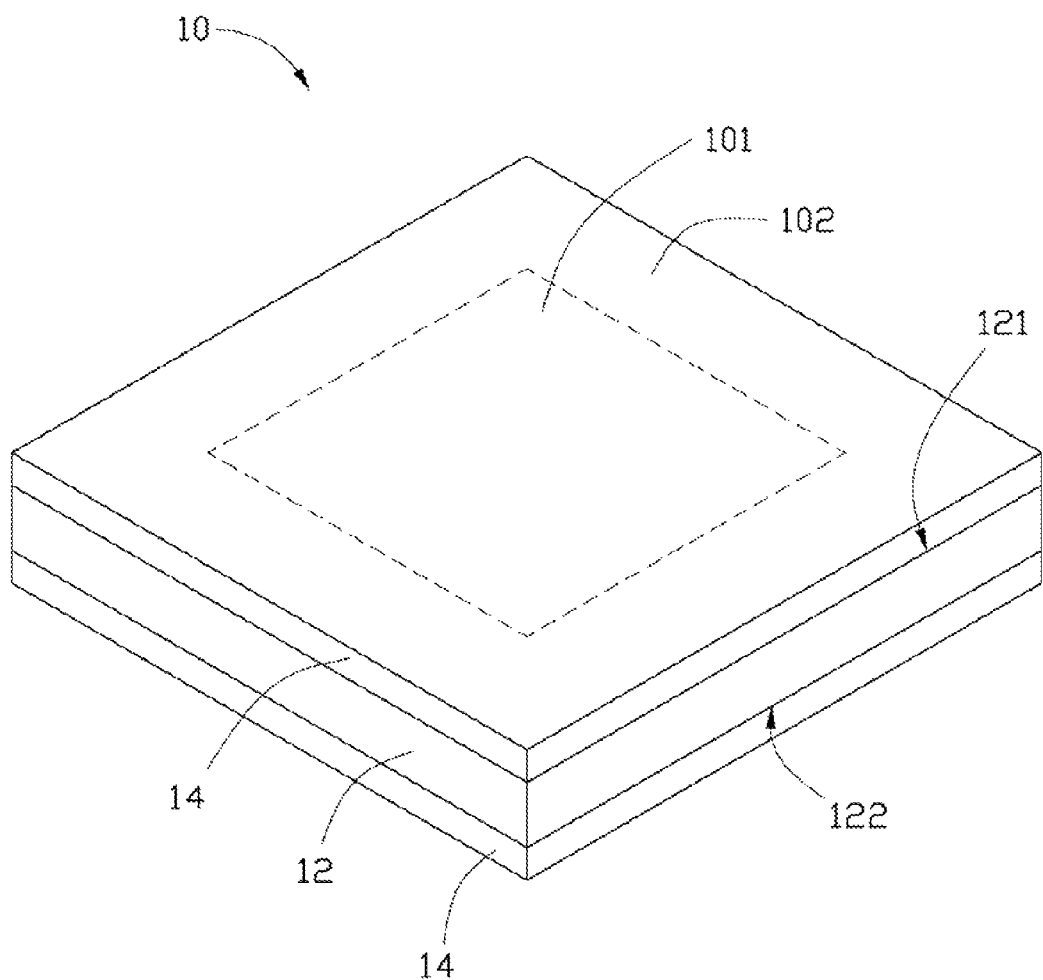
FIG. 2 is a schematic, isometric view of a PCB substrate used in the method of FIG. 1.

In step 1, referring to FIG. 2, a printed circuit board substrate 10 is provided.

The PCB substrate 10 includes an insulating layer 12 and two copper foil layers 14. The insulating layer 12 has a first surface 121 and an opposite second surface 122. In the illustrated embodiment, the two copper foil layers 14 are respectively attached to the first surface 121 and the second surface 122. That is, the PCB substrate 10 is a double-sided substrate. In an alternative embodiment, the PCB substrate 10 can be a single-sided substrate. The PCB substrate 10 includes a central portion 101 and a peripheral portion 102 surrounding the central portion 101. The central portion 101 includes a number of electrically conductive wires, and is configured to form a printed circuit board. The peripheral portion 102 is configured to be cut off.

Figure 3:
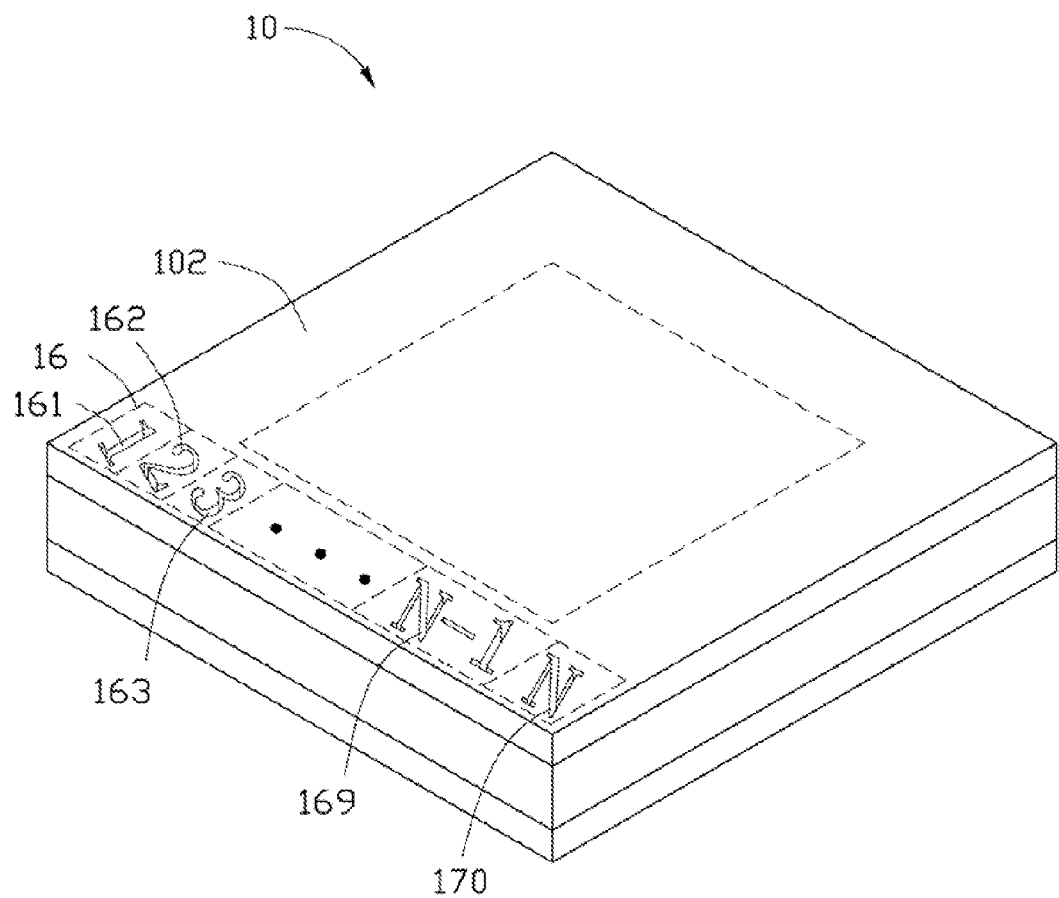
FIG. 3 is similar to FIG. 2, but showing a number of marks formed on a copper foil layer of the PCB substrate of FIG. 2.

In step 2, referring to FIG. 3, multiple marks $\{M_i\}$, i=1, 2, ..., N, are formed at the peripheral portion 102 of the PCB substrate 10 by etching one of the first copper foil layers 14.

In this embodiment, the number of the marks is N. N is a integer equal to or greater than two. The N marks include $M_1$ mark 161 to $M_N$ mark 170. The N marks are formed by a wet etching process or a laser ablation process at the peripheral portion 102.

In this exemplary embodiment, the multiple marks include a 1st mark $M_1$ 161, a 2nd mark $M_2$ 162, a 3rd mark $M_3$ 163, ..., a (N−1)th mark $M_{N-1}$ 169, and a Nth mark $M_N$ 170. In this embodiment, the N marks are Arabic numbers. The 1st mark $M_1$ 161 to the Nth mark $M_N$ 170 are Arabic numbers from 1 to N.

In an alternative embodiment, the N marks can include N different letters, such as a, b, c, d, ..., or A, B, C, D, ..., or I, II, III, IV, ..., etc. In another alternative embodiment, the N marks can include N different groups of letters, each group of which is a combination of at least two letters, such as Aa, Ab, Ac, Ad, ..., or Ba, Bb, Bc, Bd, ..., etc. In a further alternative embodiment, the N marks can include a number of groups, each of which is a combinations of a letter and a numeral, such as a1, a2, a3, a4, ..., or B1, B2, B3, B4, ..., etc.

Figure 4:
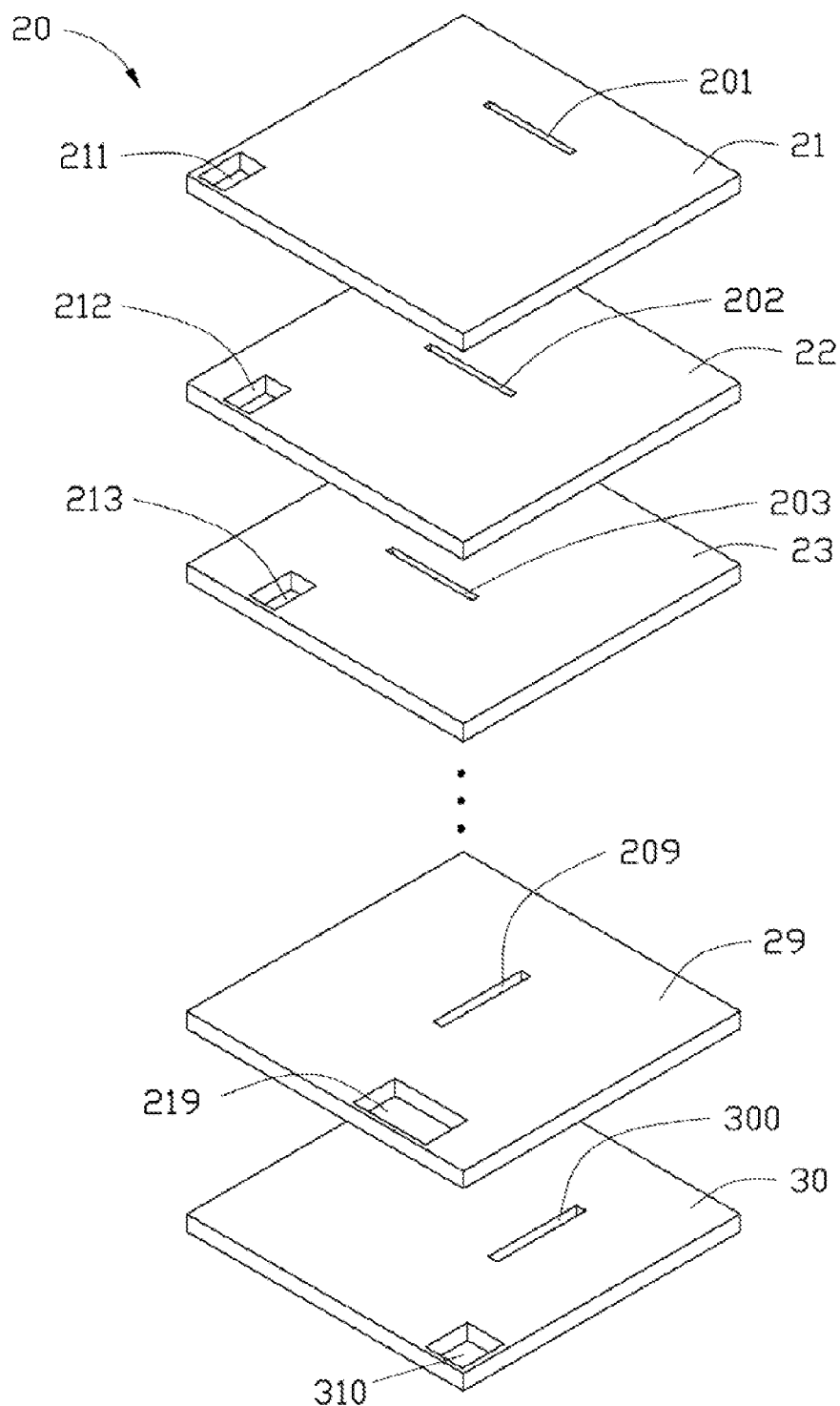
FIG. 4 is a schematic, isometric view of a number of printing screens used in the method of FIG. 1.

In step 3, referring to FIG. 4, multiple printing screens $\{S_i\}$, i=1, 2, ..., N, are provided.

The printing screens $\{S_i\}$ 20 include N screens. The N screens include a 1st screen $S_1$ 21 to an Nth screen $S_N$ 30. An ith screen $S_i$ defines an ith screen pattern. The ith screen pattern $S_i$ has an ith opening corresponding to the ith mark $M_i$, i is a natural number selected from 1 to N.

In an exemplary embodiment, the N screens includes a 1st screen $S_1$ 21, a 2nd screen $S_2$ 22, a 3rd screen $S_3$ 23, ..., a (N−1)th screen $S_{N-1}$ 29, and an Nth screen $S_N$ 30. The 1st screen $S_1$ 21, the 2nd screen $S_2$ 22, the 3rd screen $S_3$23, ..., the (N−1)th screen $S_{N-1}$ 29, and the Nth screen $S_N$ 30 respectively define a 1st screen pattern 201, a 2nd screen pattern 202, a 3rd screen pattern 203, ..., a (N−1)th screen pattern 209, and an Nth screen pattern 300. The 1st screen pattern 201, the 2nd screen pattern 202, the 3rd screen pattern 203, ..., the (N−1)th screen pattern 209, and the Nth screen pattern 300 respectively have a 1st opening 211, a 2nd opening 212, a 3rd opening 213, ..., a (N−1)th opening 219, and a Nth opening 310 corresponding to the 1st mark $M_1$ 161, the 2nd mark $M_2$ 162, the 3rd mark 163, ..., the (N−1)th mark $M_{n-1}$ 169, and the Nth mark $M_N$ 170.

Figure 5:
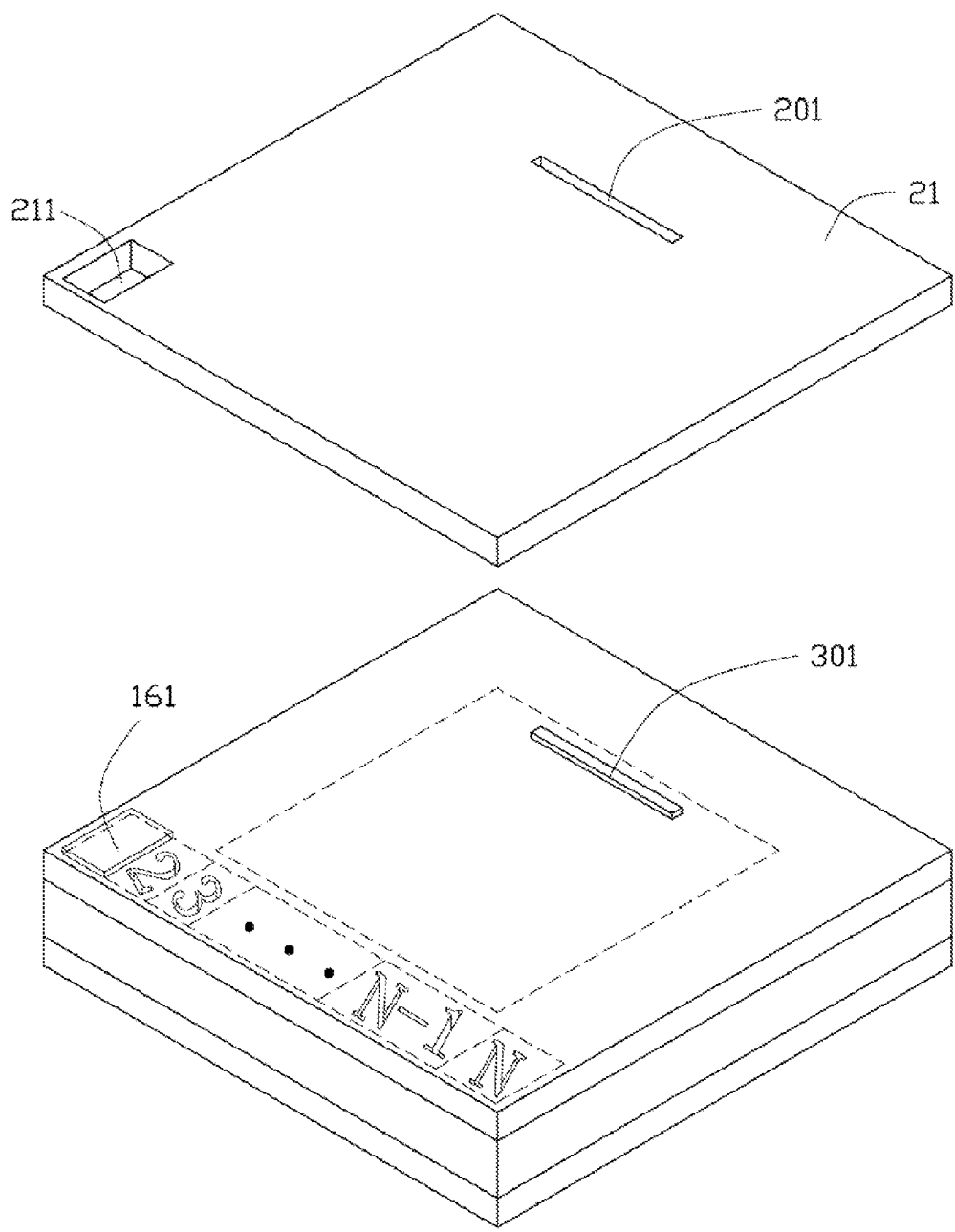
FIG. 5 is similar to FIG. 3, but showing a 1st printing pattern formed on the copper foil layer by a 1st printing screen.

In step 4, referring to FIG. 5, the first screen $S_1$ 21 is attached on the surface of the copper foil layer 14, the first mark $M_1$ 161 is exposed at the first opening 211.

In step 5, printing material is applied on the first screen $S_1$ 21 so as to forming an first printing pattern 301 on the copper foil layer 14. The printing material covers the first mark $M_1$ 161 at the first opening 211. The first printing pattern 301 conforms to the first screen pattern 201.

In step 6, the first mark $M_1$ 161 is checked whether to be covered by the printing material or not.

If the 1st mark $M_1$ 161 is covered by the printing material, a 2nd printing pattern in correspondence with the 2nd screen pattern will be formed on the surface of the copper foil layer 14. If not, a process of forming a 2nd printing pattern on the surface of the copper foil layer 14 is stopped, and do as the step 4 and the step 5 to form the first printing pattern 301.

Figure 6:
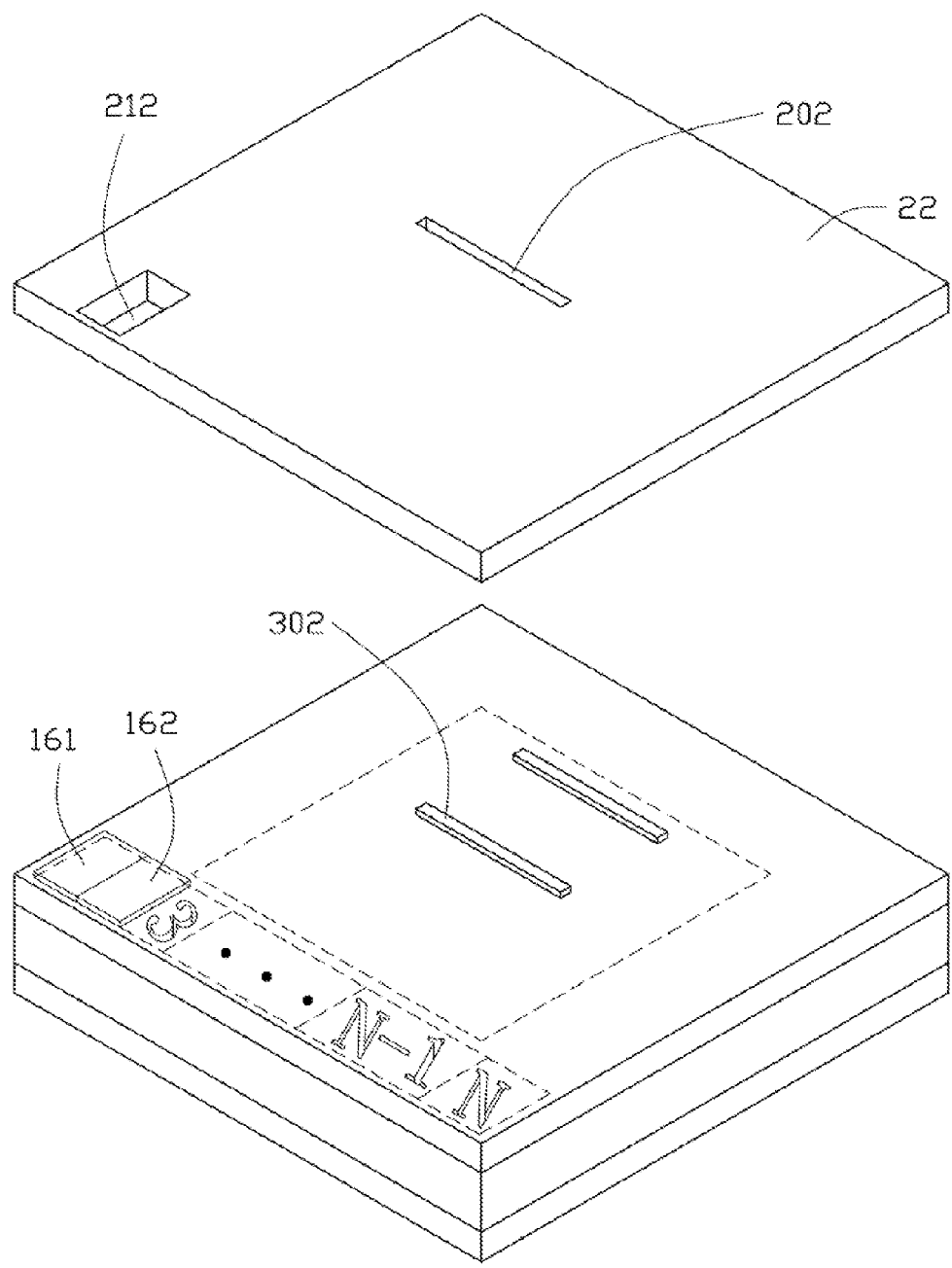
FIG. 6 is similar to FIG. 5, but showing a 2nd printing pattern formed on the copper foil layer by a 2nd printing screen.

In step 7, referring to FIG. 6, the second screen $S_2$ 22 is attached on the surface of the copper foil layer 14, the second mark $M_2$ 162 is exposed at the second opening 212.

In step 8, printing material is applied on the second screen $S_2$ 22 so as to forming an second printing pattern 302 on the copper foil layer 14. The printing material covers the second mark $M_2$ 162 at the second opening 212. The second printing pattern 302 conforms to the second screen pattern 202.

Figure 7:
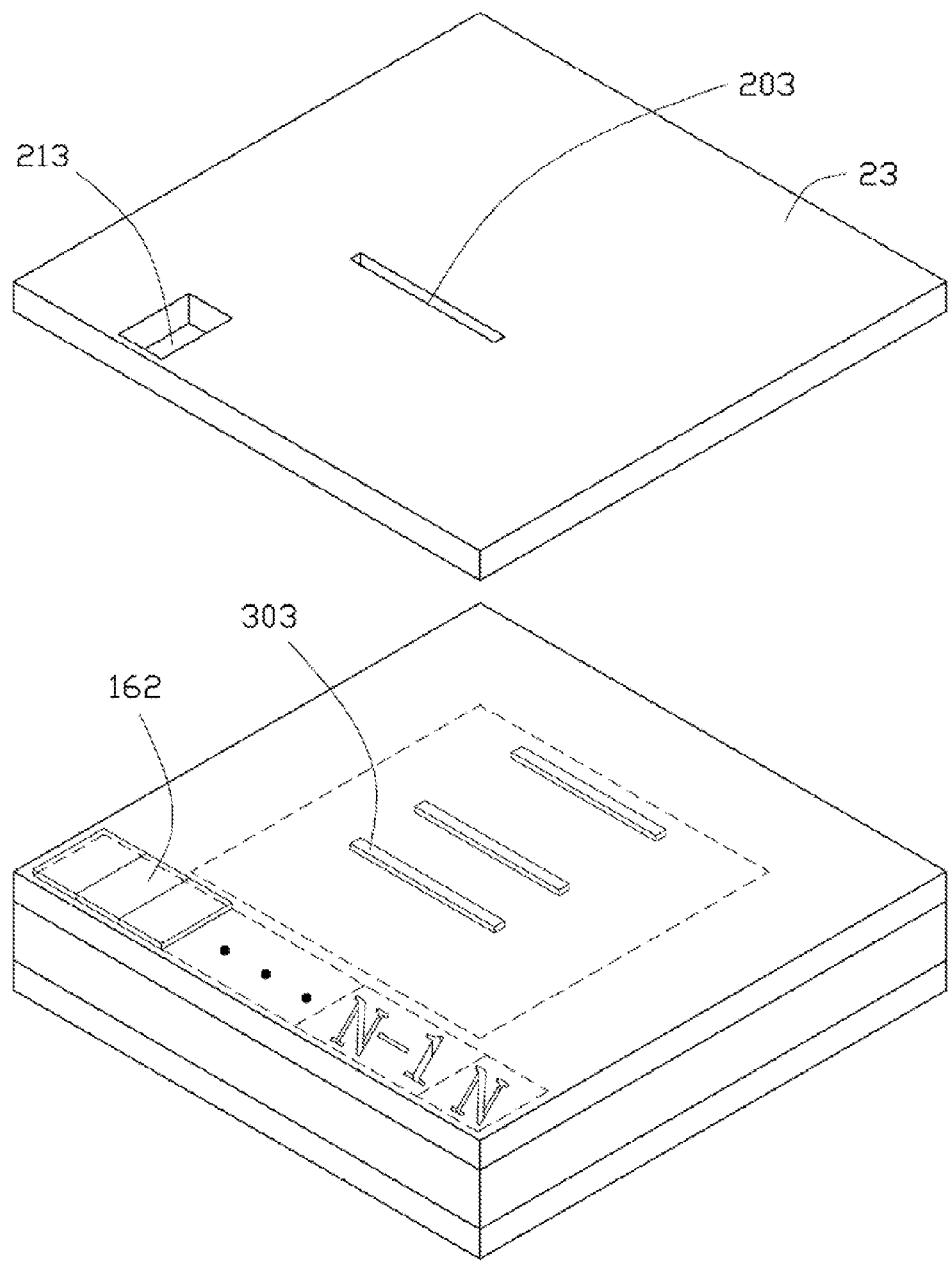
FIG. 7 is similar to FIG. 6, but showing a 3rd printing pattern formed on the copper foil layer by a 3rd printing screen.

Referring to FIG. 7, before a 3rd printing pattern 303 in correspondence with the 3rd screen pattern 203 is formed on the surface of the copper foil layer 14, the 2nd mark $M_2$ 162 is checked whether to be covered by the printing material or not. If the 2nd mark $M_2$ 162 is covered by the printing material, a 3rd printing pattern 303 in correspondence with the 3rd screen pattern 203 is formed on the surface of the copper foil layer 14. If not, a process of forming a second printing pattern 302 on the surface of the copper foil layer 14 is applied.

Thee 4th printing pattern to the (N−1)th printing pattern 399 is formed on the surface of the copper foil layer 14 by using a process similar to the above.

Figure 8:
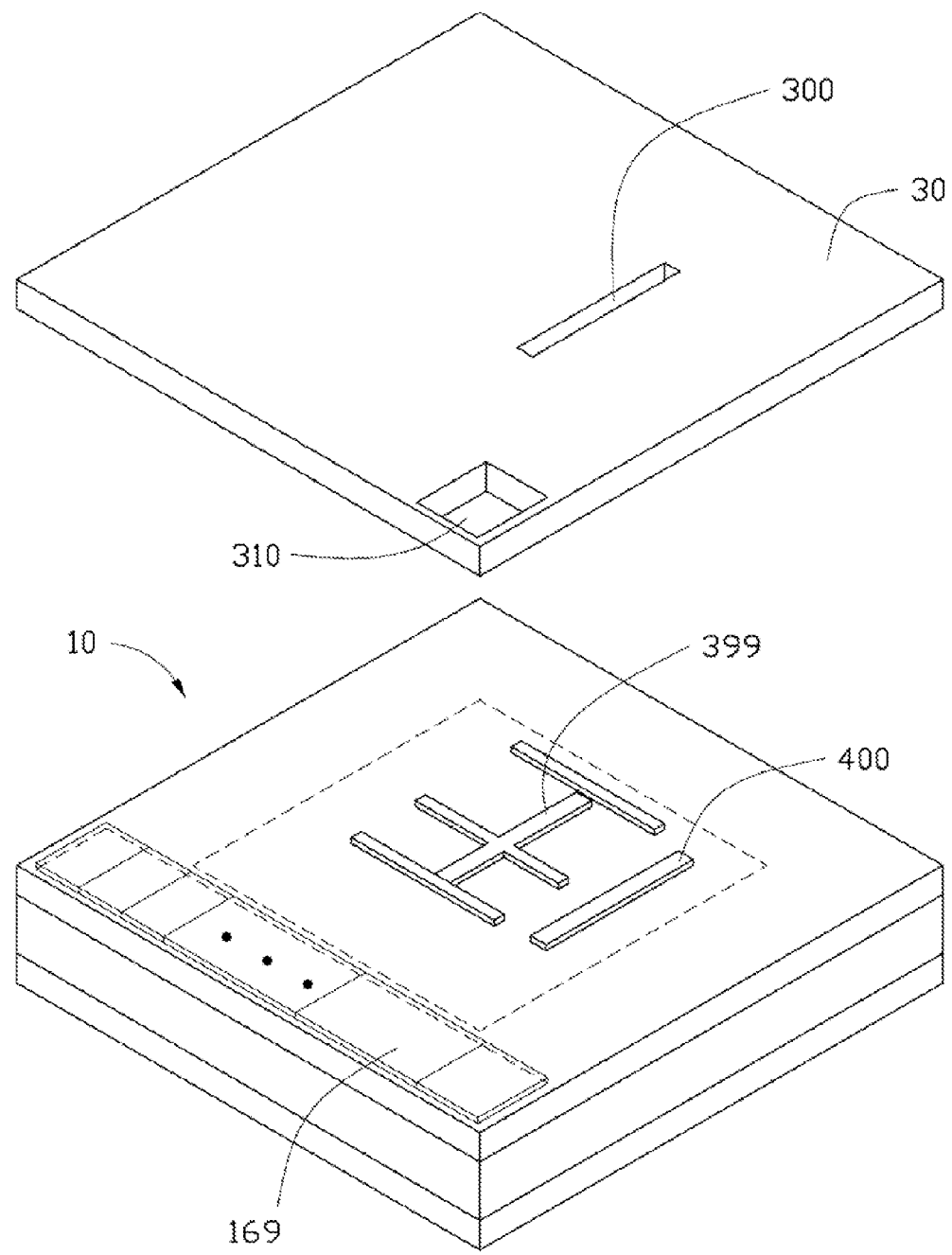
FIG. 8 is similar to FIG. 7, but showing an Nth printing pattern formed on the copper foil layer by an Nth printing screen.

Finally, referring to FIG. 8, before an Nth printing pattern 400 in correspondence with the Nth screen pattern 300 is formed on the surface of the copper foil layer 14, the (N−1)th mark $M_{N-1}$ 169 is checked whether to be covered by the printing material or not. If the (N−1)th mark $M_{N-1}$ 169 is covered by the printing material, an Nth printing pattern 400 in correspondence with the Nth screen pattern 300 is formed on the surface of the copper foil layer 14. If not, a process of forming an Nth printing pattern 400 on the surface of the copper foil layer 14 is stopped.

After the Nth printing pattern 400 is formed, a printed circuit board substrate with a number of printing patterns is obtained. For the ith mark $M_i$ whether to be covered by the printing material or not is checked before an (i+1)th printing pattern is formed on the surface of the copper foil layer 14, the above method for screen printing a printed circuit board substrate may skip one or more printing processes.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

The invention claimed is:

1. A method for screen printing a printed circuit board substrate, the method comprising:
    providing a printed circuit board substrate comprising an insulating layer and a copper foil layer formed on the insulating layer;
    forming multiple marks $\{M_i\}$, i=1, 2, ..., N, on the copper foil layer, N being an integer equal to or greater than two;
    providing multiple screens $\{S_i\}$, i=1, 2, ..., N, wherein the ith screen $S_i$ comprises an ith screen pattern and an ith opening spatially corresponding to the ith mark $M_i$;
    attaching the ith screen $S_i$ on the copper foil layer in a manner such that the ith Mark $M_i$ is exposed through the ith opening;
    applying printing material on the ith screen Si so as to form an ith printing pattern on the copper foil layer to cover the ith Mark $M_i$ at the ith opening, the ith printing pattern conforming to the ith screen pattern;
    checking whether the ith mark is covered by the printing material when i is less than N; and
    applying printing material on the (i+1)th screen $S_{i+1}$ so as to form an (i+1)th printing pattern on the copper foil layer to cover the (i+1)th Mark $M_{i+1}$ at the (i+1)th opening, if the ith mark is covered by the printing material.

2. The method of claim 1, wherein the printed circuit board substrate includes a central portion and a peripheral portion surrounding the central portion, the central portion includes a number of electrically conductive wires, and the marks are formed at the peripheral portion.

3. The method of claim 1, wherein the marks are Arabic numbers or Roman numbers.

4. The method of claim 3, wherein the multiple marks $\{M_i\}$ are consecutive integers from 1 to N.

5. The method of claim 1, wherein the ith mark $M_i$ includes at least a letter.

6. The method of claim 1, wherein the ith mark $M_i$ is a combination of at least two letters.

7. The method of claim 1, wherein the ith mark $M_i$ is a combination of at least a numeral and at least a letter.

8. The method of claim 1, wherein the multiple marks {Mi} are formed by a wet etching process or a laser ablation process.

* * * * *